United States Patent
Gandikota et al.

(10) Patent No.: US 11,414,751 B2
(45) Date of Patent: *Aug. 16, 2022

(54) SELF-ALIGNED STRUCTURES FROM SUB-OXIDES

(71) Applicant: Applied Materials, Inc., Santa Clara, CA (US)

(72) Inventors: Srinivas Gandikota, Santa Clara, CA (US); Susmit Singha Roy, Sunnyvale, CA (US); Abhijit Basu Mallick, Palo Alto, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 259 days.

This patent is subject to a terminal disclaimer.

(21) Appl. No.: 16/643,967

(22) PCT Filed: Aug. 28, 2018

(86) PCT No.: PCT/US2018/048343
§ 371 (c)(1),
(2) Date: Mar. 3, 2020

(87) PCT Pub. No.: WO2019/050715
PCT Pub. Date: Mar. 14, 2019

(65) Prior Publication Data
US 2021/0047728 A1    Feb. 18, 2021

Related U.S. Application Data

(60) Provisional application No. 62/554,306, filed on Sep. 5, 2017.

(51) Int. Cl.
| | | |
|---|---|---|
| C23C 16/40 | (2006.01) | |
| C23C 16/34 | (2006.01) | |
| C23C 16/455 | (2006.01) | |
| C23C 16/56 | (2006.01) | |
| H01L 21/02 | (2006.01) | |

(52) U.S. Cl.
CPC .......... *C23C 16/405* (2013.01); *C23C 16/34* (2013.01); *C23C 16/45525* (2013.01); *C23C 16/45536* (2013.01); *C23C 16/56* (2013.01); *H01L 21/0228* (2013.01); *H01L 21/02175* (2013.01); *H01L 21/02244* (2013.01); *H01L 21/02274* (2013.01)

(58) Field of Classification Search
None
See application file for complete search history.

(56) References Cited

U.S. PATENT DOCUMENTS

| | | | | |
|---|---|---|---|---|
| 5,691,235 A | * | 11/1997 | Meikle | C23C 16/34 257/E21.011 |
| 8,399,363 B1 | | 3/2013 | Lee et al. | |
| 8,575,753 B2 | * | 11/2013 | Choi | H01L 45/06 257/758 |
| 10,083,834 B2 | | 9/2018 | Thompson et al. | |
| 11,131,015 B2 | * | 9/2021 | Mullick | C23C 8/16 |
| 2011/0028002 A1 | * | 2/2011 | Hirota | H01L 27/10852 438/761 |
| 2011/0089393 A1 | | 4/2011 | Kuo-Pin et al. | |
| 2011/0207318 A1 | | 8/2011 | Usami | |
| 2013/0241037 A1 | * | 9/2013 | Jeong | H01L 45/08 257/536 |
| 2015/0325622 A1 | | 11/2015 | Zhang et al. | |

FOREIGN PATENT DOCUMENTS

| | | |
|---|---|---|
| KR | 20000026588 A | 5/2000 |
| KR | 20090112060 A1 | 10/2009 |
| KR | 20100105315 A1 | 9/2010 |
| KR | 20170017789 A | 2/2017 |
| TW | 201403829 A | 1/2014 |
| TW | 201624715 A | 7/2016 |

OTHER PUBLICATIONS

PCT International Search Report and Written Opinion in PCT/US2018/048343 dated Dec. 13, 2018, 11 pages.

* cited by examiner

*Primary Examiner* — Jose I Hernandez-Kenney
(74) *Attorney, Agent, or Firm* — Servilla Whitney LLC

(57) ABSTRACT

Methods of producing a self-aligned structure are described. The methods comprise forming a metal sub-oxide film in a substrate feature and oxidizing the sub-oxide film to form a self-aligned structure comprising metal oxide. In some embodiments, a metal film is deposited and then treated to form the metal sub-oxide film. In some embodiments, the process of depositing and treating the metal film to form the metal sub-oxide film is repeated until a predetermined depth of metal sub-oxide film is formed within the substrate feature.

20 Claims, 4 Drawing Sheets

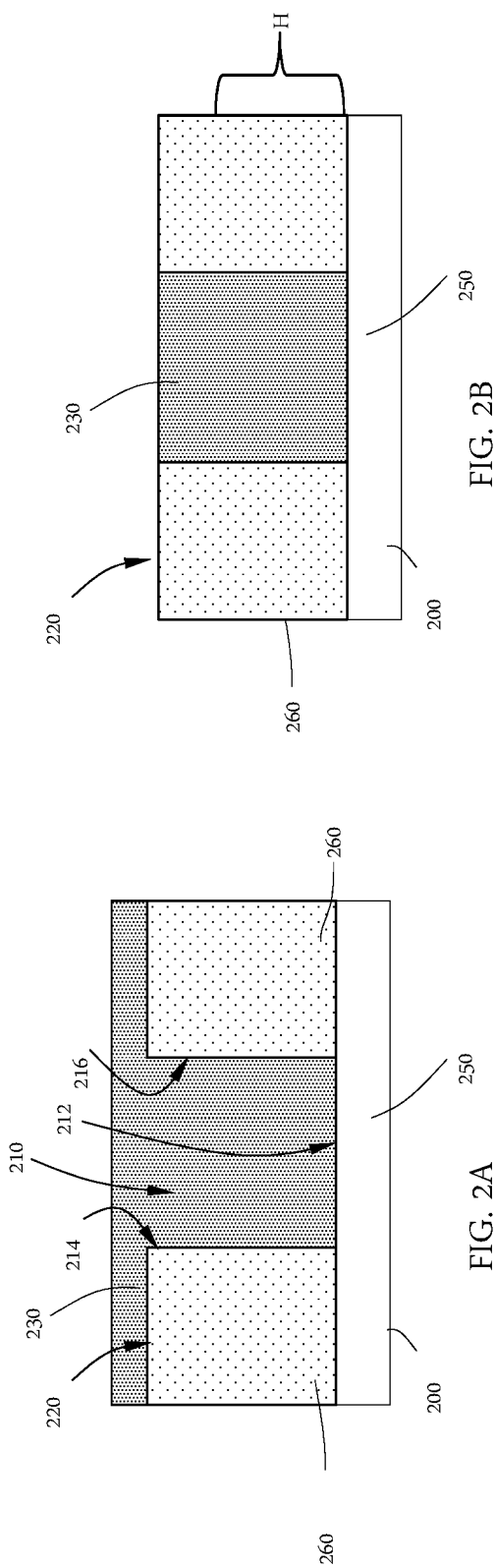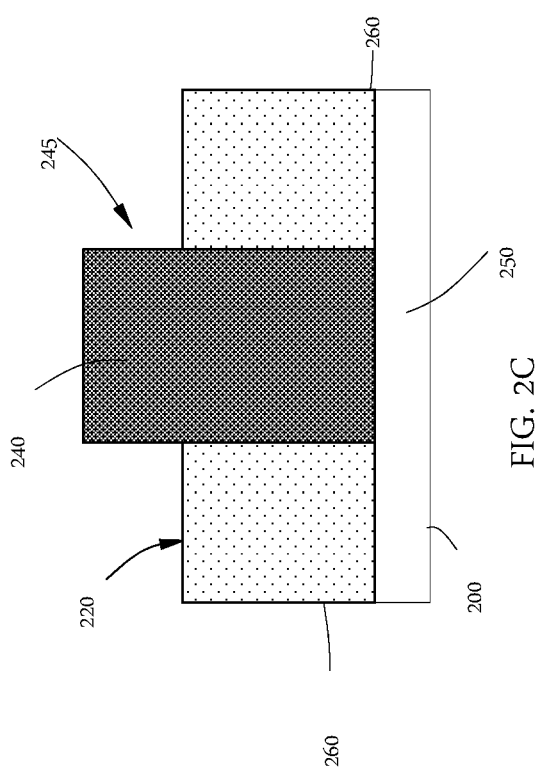

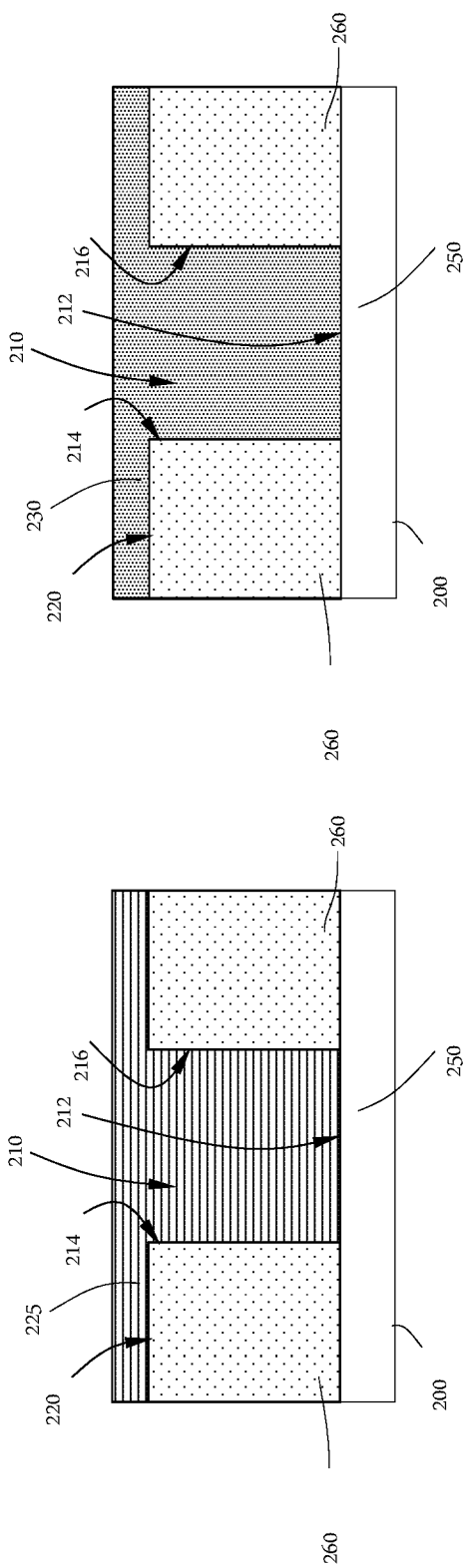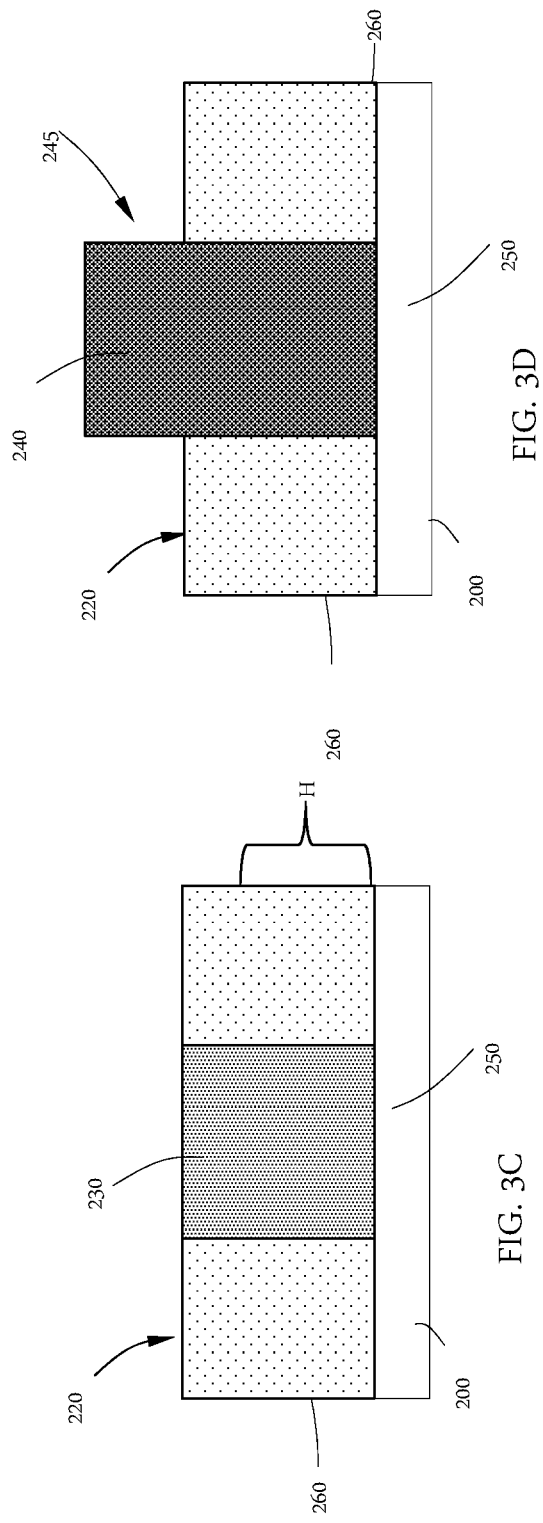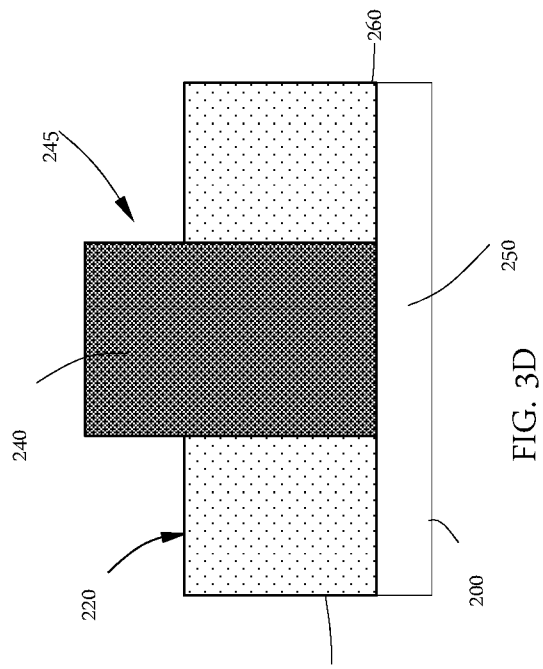

SELF-ALIGNED STRUCTURES FROM SUB-OXIDES

CROSS-REFERENCE TO RELATED APPLICATIONS

This application is the National Stage entry of PCT/US2018/048343, filed on Aug. 28, 2018, which claims priority to U.S. Provisional Application. Ser. No. 62/554,306, filed Sep. 5, 2017, the entire disclosures of which are hereby incorporated by reference herein.

TECHNICAL FIELD

The present disclosure relates generally to methods of depositing and processing thin films. In particular, the disclosure relates to processes for producing self-aligned structures.

BACKGROUND

Self-aligned metal oxide pillars can be formed through the oxidation of gap-filled metal films. Metal is deposited on the structure of holes or trenches by ALD and then oxidizing it to form metal oxides and the volume expansion during oxidization pushes a pillar out of the holes or trenches. The pillars are bottom-up, selectively grown from metal only.

However, there are some challenges of using this process because of the rapid volume expansion of the metal to form the metal oxide columns. First, rapid changes in stress sometimes lead to degradation of the inherent structure. This can lead to bending of tall columns sometimes when the CD is small. Second, rapid change in the volume sometimes leads to adhesion issues between the metal oxide pillar and the substrate. Third, residual, un-oxidized, metal often remains at the bottom of the trench.

There is a need in the art for alternative methods to create self-aligned columns and structures. More specifically, there is a need in the art for alternative methods to create self-aligned columns and structures which afford a slower rate of formation.

SUMMARY

One or more embodiments of the disclosure are directed to methods of producing a self-aligned structure. The methods comprise providing a substrate with a substrate surface that has at least one feature. The feature extends a distance into the substrate from the surface and has a sidewall and bottom. A metal sub-oxide film is formed on the substrate surface and in the at least one feature. The metal sub-oxide film is removed from the substrate surface outside of the at least one feature. The metal sub-oxide film is oxidized to form a self-aligned structure of metal oxide that expands from the feature. The metal sub-oxide film has an average metal oxidation state in the range of greater than 0 to less than the average oxidation state of the metal oxide.

Additional embodiments of the disclosure are directed to methods of producing a self-aligned structure. The methods comprise providing a substrate with a substrate surface that has at least one feature. The feature extends a distance into the substrate from the substrate surface and has a sidewall and bottom. A metal film is formed on the substrate surface and in the feature. The metal film is treated to form a metal sub-oxide film on the substrate surface and in the feature. The metal sub-oxide film is removed from the substrate surface outside of the feature. The metal sub-oxide film is oxidized to form a self-aligned structure of metal oxide that expands from the feature. The metal sub-oxide film has an average metal oxidation state in the range of greater than 0 to less than the average metal oxidation state of the metal oxide.

Further embodiments of the disclosure are directed to a method of producing a self-aligned structure. The method comprises providing a substrate with a substrate surface that has at least one feature. The feature extends a distance into the substrate from the substrate surface and has a sidewall and bottom. A metal film is formed on the substrate surface that partially fills the feature. The metal film is treated to form a metal sub-oxide film. The formation and treatment of the metal film are repeated until a predetermined volume of the feature has been filled. The metal sub-oxide film is removed from the substrate surface outside of the feature. The metal sub-oxide film is oxidized to form a self-aligned structure of metal oxide that expands from the feature. The metal sub-oxide film has an average metal oxidation state in the range of greater than 0 to less than the average metal oxidation state of the metal oxide.

BRIEF DESCRIPTION OF THE DRAWINGS

So that the manner in which the above recited features of the present disclosure can be understood in detail, a more particular description of the disclosure, briefly summarized herein, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 2A through 2C show a cross-sectional schematic of a self-aligned structure formation process in accordance with one or more embodiments of the disclosure.

FIGS. 3A through 3D show a cross-sectional schematic of a self-aligned structure formation process in accordance with one or more embodiments of the disclosure.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure are directed to methods for depositing metal sub-oxide films for any conformal, nonconformal and/or low to high aspect ratio gap/trench/void filling applications. Embodiments of the disclosure advantageously provide methods of depositing a film (e.g., a metal sub-oxide film) in high aspect ratio (AR) structures with small dimensions. Some embodiments of the disclosure advantageously provide methods of oxidizing the metal sub-oxide film to produce self-aligned structures.

One or more embodiments of the disclosure provide methods for producing self-aligned structures which are produced more slowly. Without being bound by theory, the slower rate of formation provides for less volumetric expansion of the metal sub-oxide film and structures which demonstrate better adhesion to the substrate and less degradation of the self-aligned structure.

Figure 1:
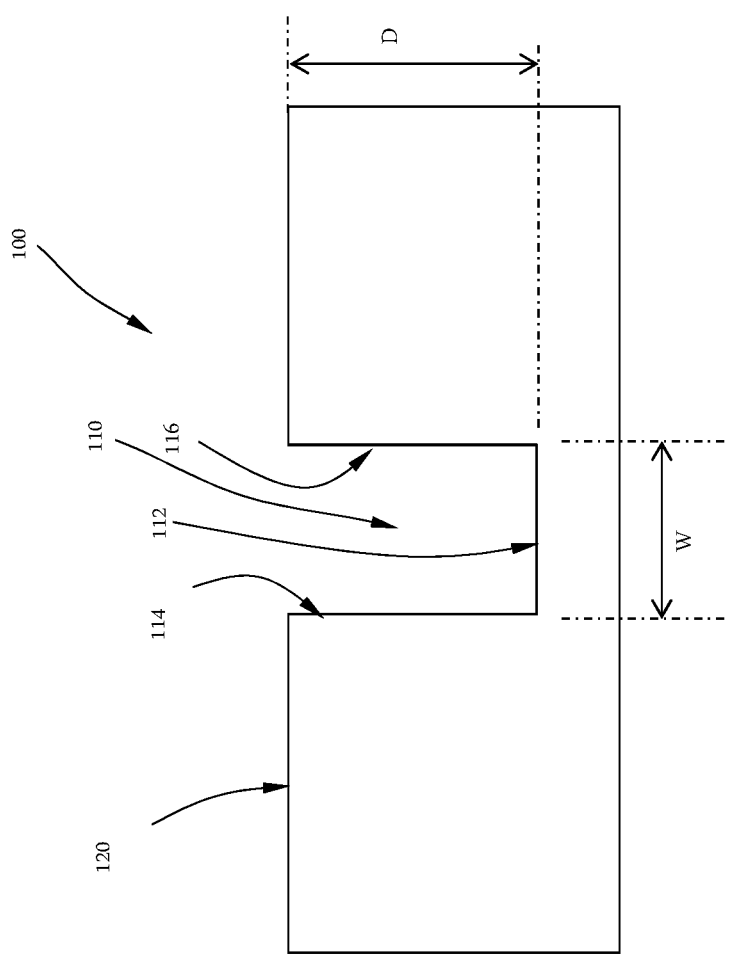
FIG. 1 shows a cross-sectional view of a substrate feature in accordance with one or more embodiments of the disclosure.

FIG. 1 shows a partial cross-sectional view of a substrate 100 with a feature 110. The Figures show substrates having a single feature for illustrative purposes; however, those skilled in the art will understand that there can be more than one feature. The shape of the feature 110 can be any suitable shape including, but not limited to, trenches and cylindrical vias. In specific embodiments, the feature 110 is a trench. As used in this regard, the term "feature" means any intentional surface irregularity. Suitable examples of features include, but are not limited to trenches which have a top, two sidewalls and a bottom, peaks which have a top and two sidewalls extending upward from a surface and vias which have sidewalls extending down from a surface with an open bottom. Features or trenches can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

The substrate 100 has a top surface 120. The at least one feature 110 forms an opening in the top surface 120. The feature 110 extends from the top surface 120 to a depth D to a bottom surface 112. The feature 110 has a first sidewall 114 and a second sidewall 116 that define a width W of the feature 110. The open area formed by the sidewalls and bottom are also referred to as a gap.

Metal oxide pillars can be formed in features as self-aligned structures. A metal sub-oxide film can be used to fill a trench. After filling the trench, the over-burden (i.e., metal sub-oxide deposited on top of the substrate outside of the trenches) is removed by a chemical-mechanical planarization (CMP) process to separate the metal sub-oxide lines. The resulting metal sub-oxide lines can be annealed with oxidizing atmosphere to form metal oxide pillars.

With reference to FIGS. 2A through 2C, a substrate 200 is provided for processing. The substrate 200 is similar to the substrate 100 shown in FIG. 1. As used in this regard, the term "provided" means that the substrate is placed into a position or environment for further processing. The substrate 200 illustrated in FIG. 2A has a first surface material 250 and a second surface material 260. The first surface material 250 and the second surface material 260 may be the same or different surface materials on the substrate 200. The feature 210 is formed with the bottom 212 being the first surface 250 and the sidewalls 214, 216 and the top surface 220 being the second surface material 260.

A film 230 is formed on the top surface 220 and the walls and bottom of the feature 210. The film 230 can be any suitable film formed by any suitable process including, but not limited to, chemical vapor deposition, plasma-enhanced chemical vapor deposition, atomic layer deposition, plasma-enhanced atomic layer deposition and/or physical vapor deposition. In some embodiments, the film 230 is formed by atomic layer deposition or plasma-enhanced atomic layer deposition.

In some embodiments, the film 230 forms conformally on the at least one feature 210. As used herein, the term "conformal", or "conformally", refers to a layer that adheres to and uniformly covers exposed surfaces with a thickness having a variation of less than 1% relative to the average thickness of the film. For example, a 1,000 Å thick film would have less than 10 Å variations in thickness. This thickness and variation includes edges, corners, sides, and the bottom of recesses. For example, a conformal layer deposited by ALD in various embodiments of the disclosure would provide coverage over the deposited region of essentially uniform thickness on complex surfaces.

In some embodiments, the film 230 is deposited to a thickness in the range of about 25 Å to about 200 Å, or in the range of about 50 Å to about 150 Å. In one or more embodiments, the film 230 is deposited to a thickness of about 50 Å and there is substantially no seam formed in the film. The formation of the seam occurs where the thickness of the film closes on the top part of the feature 210 before the feature is filled with the film. In some embodiments, the substrate surface has a film with a seam between the sidewalls of the at least one feature. As used in this regard, the term "between" means that there is some film on either side of the seam between the seam and the sidewall of the feature. The seam is not limited to being exactly in the center of the sidewalls.

In some embodiments, the film 230 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

In some embodiments, the film 230 is formed substantially seamlessly within the feature 210. In some embodiments, a seam may be formed within the width of the feature 210. The seam can be any gap, space or void that forms between the walls 214, 216 of the feature 210.

The film 230 can be any suitable material with an oxidation state less than the oxidation state of the full oxide. In some embodiments, the film 230 is a metal sub-oxide film.

As used herein, a sub-oxide is any metal complex where the oxidation state of the metal is greater than 0 and less than the oxidation state of the metal in its fully oxidized form (i.e. highest oxidation state). For example, tungsten oxide may exist in several forms, namely, $W_2O_3$, $WO_2$ or $WO_3$. In this case, both $W_2O_3$ and $WO_2$ would be considered sub-oxides since they correspond to oxidation states of +3 and +4 respectively and $WO_3$ has an oxidation state of +6. Those skilled in the art will recognize that sub-oxides do not need to contain oxygen. In some embodiments, suitable sub-oxides may contain one or more of oxygen, boron, nitrogen, carbon, germanium or silicon. Stated differently, in some embodiments, suitable metal sub-oxides may comprise metal oxides, metal nitrides, metal borides, metal carbides, metal germanides, metal silicides, or combinations thereof (i.e. metal oxynitrides). In some embodiments, the metal sub-oxide consists essentially of a metal nitride.

Those skilled in the art will understand that the metal sub-oxide film may have a non-stoichiometric amount of atoms. For example, a film designated as WN may have different amounts of tungsten and nitrogen. The WN film may be, for example, 90 atomic % tungsten. The use of WN to describe a tungsten nitride film means that the film comprises tungsten and nitrogen atoms and should not be taken as limiting the film to a specific composition. In some embodiments, the film consists essentially of the designated atoms. For example, a film consisting essentially of WN means that the composition of the film is greater than or equal to about 95%, 98% or 99% tungsten and nitrogen atoms. In some embodiments, the film 230 comprises tungsten. In one or more embodiments, the film 230 comprises titanium.

In FIG. 2B, the film 230 is removed from the top surface 220 such that it is contained entirely within the feature 210. The film 230 can be removed by any suitable etch process. In some embodiments, the film 230 is removed by a chemical-mechanical planarization (CMP) process.

In some embodiments, substantially all of the film 230 is formed within the feature 210. As used in this regard, the term "substantially all" means that greater than or equal to about 95%, 98% or 99% of the film is formed within the feature 210 on a weight basis.

In some embodiments, the film 230 is selectively deposited within the feature 210 and is not deposited on the top surface 220 of the substrate. In these embodiments, the substrate 200 would be processed such that it would flow from FIG. 1 to FIG. 2B without appearing like FIG. 2A. The compositions of the first surface material 250 and the second surface material 260 can be chosen to allow selective deposition of the film 230 on one surface relative to the other.

In some embodiments, the method includes selectively depositing a film 230 within the trench to a height H less than or equal to the depth of the feature 210. In one embodiment, the film 230, fills at least 10% of the volume of the trench. In other embodiments, the film 130 fills at least 15%, 20%, 25%, 30%, 35%, 40%, 45%, 50%, 55%, 60%, 65%, 70%, 75%, 80%, 85%, 90%, 95% or 100% of the volume of the trench. In some embodiments, the film 230 deposited in the feature 210 has a height H that is less than or equal to about 98%, 95%, 90%, 80%, 70%, 60% or 50% of the depth of the feature 210.

As shown in FIG. 2C, the processing method further comprises treating the film 230 to expand the film material volume to provide an expanded film 240. The expanded film 240 extends beyond the top surface 220 of the substrate. The expanded film 240 comprises a metal oxide. The expanded film 240 forms a self-aligned structure.

The film 230 has an average metal oxidation state in the range of greater than 0 to less than the average metal oxidation state of the expanded film 240. In some embodiments, the film 230 has a metal to oxide ratio less than or equal to about 80% of a metal to oxide ratio of the expanded film 240. In some embodiments, the expanded film 240 is substantially orthogonal to the top surface 220 of the substrate.

Suitable metals for use in metal or metal sub-oxide films include, but are not limited to metals having a Pilling-Bedworth ratio greater than 2, greater than 2.25, or greater than 2.5. Pilling-Bedworth ratio refers to a ratio of a volume of the elementary cell of a metal oxide to the volume of the elementary cell of the corresponding metal from which the oxide is formed. The Pilling-Bedworth ratio is defined as the $V_{oxide}/V_{metal}$, where V is volume. For determining the Pilling-Bedworth ratio of a metal oxide, $V_{oxide}$ equals the molecular mass of the of the metal oxide multiplied by the density of the metal, and $V_{metal}$ equals the number of atoms of metal per one molecule of the oxide multiplied by the atomic mass of the metal multiplied by the density of the oxide. Examples of such films include one or more of Co, Mo, W, Ta, Ti, Ru, Rh, Cu, Fe, Mn, V, Nb, Hf, Zr, Y, Al, Sn, Cr, Os, U and/or La. In some embodiments, the metal is selected from the group consisting of Co, Fe, Mn, Nb, Os, Ta, U, and V. In some embodiments, the metal has a Pilling-Bedworth ratio of greater than 2, greater than 2.25, or greater than 2.5. In some embodiments, the metal is selected from the group consisting of Mo, Os, and V. In some specific embodiments, the metal comprises tungsten. In some specific embodiments, the metal excludes tungsten.

The film 230 can be any suitable material including, but not limited to materials comprising Co, Cr, Fe, Mn, Nb, Os, Ta, U, W and V. In some embodiments, the metal of the metal sub-oxide film is tungsten.

In some embodiments, the expanded metal film comprises $WO_3$. In some embodiments, the film 230 has a tungsten to oxygen ratio less than or equal to about 1:2.8. In some embodiments, the expanded film 240 has a tungsten to oxygen ratio greater than or equal to about 1:2.85.

The expansion of the film 230 can be in the range of about 10% to about 1000%, or in the range of about 50% to about 800%, or in the range of about 100% to about 700%. In some embodiments, the film 230 expands by an amount greater than or equal to about 150%, 200%, 250%, 300% or 350%. In some embodiments, the film 230 expands an amount in the range of about 300% to about 400%. In one or more embodiments, treating the film results in the film volume increasing by at least 10%, 20%, 30%, 40%, 50%, 60%, 70%, 80%, 90%, 100%, 150%, 200%, 250%, 300%, 350% or 400%. When a plurality of features is filled with the film 230, a plurality of expanded films 240 can be formed to provide self-aligned structures. In some embodiments, these self-aligned structures can act as a pattern without using a mask.

In one embodiment, treating the film 230 comprises exposing the film to an oxidizing environment. In embodiments in which treating the initial film comprises exposing the initial film to an oxidizing environment the expanded film 240 may comprise a material selected from the group consisting of $CoO$, $Fe_2O_3$, $Fe_3O_4$, $MnO_2$, $Mn_2O_3$, $Mn_3O_4$, $MoO_3$, $Nb_2O_5$, $Ta_2O_5$, $OsO_2$, $UO_2$, and $V_2O_5$.

In some embodiments, treating the film 130 comprises exposing the initial film to an oxidizing agent comprising one or more of $O_2$, $O_3$, $N_2O$, $H_2O$, $H_2O_2$, $CO$, $CO_2$, $NH_3$, $N_2/Ar$, $N_2/He$ or $N_2/Ar/He$. In some embodiments, the oxidizing conditions comprise a thermal oxidation, plasma enhanced oxidation, remote plasma oxidation, microwave and radio-frequency (e.g., ICP, CCP).

Treating the film 230 can occur at any suitable temperature depending on, for example, the composition of the film and the expanding agent. In some embodiments, the film expansion occurs at a temperature in the range of about 25° C. to about 1100° C. In some embodiments, expansion occurs at a temperature greater than or equal to about 250° C., 300° C., 350° C., 400° C., 450° C., 500° C. or 550° C.

In some embodiments, treating the film 230 occurs at a temperature less than or equal to about 450° C., or 400° C., or 350° C., or 300° C., or 250° C. or 200° C. In some embodiments, the film 230 comprises tungsten and is formed at a temperature in the range of about 150° C. to about 200° C.

As shown in FIG. 2C, during expansion, the fidelity of the feature shape is maintained on the top of the feature so that the film 230 grows straight up from the feature 210. As used in this regard, "straight up" means that the sides of the expanded film 240 are substantially coplanar with the sidewall 214, 216 of the feature 210. A surface is coplanar with the sidewall 214 where the angle formed at the junction of the sidewall 214 and the surface is ±10°. In this regard, an expanded film which extends "straight up" from the feature may be described as orthogonal to the top surface of the substrate if the sidewalls are perpendicular to the top surface.

Metal oxide pillars can be formed in features as self-aligned structures. A metal film can be used to fill a trench. The metal film can be treated to form a metal sub-oxide film. Any over-burden (i.e., metal or metal sub-oxide deposited on top of the substrate outside of the trenches or above the top surface of the substrate) is removed by a chemical-mechanical planarization (CMP) process to separate the metal sub-oxide lines. The resulting metal sub-oxide lines can be annealed with oxidizing atmosphere to form metal oxide pillars.

With reference to FIGS. 3A through 3D, a substrate 200 is provided for processing. The substrate 200 is similar to the substrate 100 shown in FIG. 1. As used in this regard, the term "provided" means that the substrate is placed into a position or environment for further processing. The substrate 200 illustrated in FIG. 3A has a first surface material 250 and a second surface material 260. The first surface material 250 and the second surface material 260 may be the same or different surface materials on the substrate 200. The feature 210 is formed with the bottom 212 being the first surface material 250 and the sidewalls 214, 216 and the top surface 220 being the second surface material 260.

A metal film 225 is formed on the top surface 220 and the walls and bottom of the feature 210. The metal film 225 can be any suitable film formed by any suitable process including, but not limited to, chemical vapor deposition, plasma-enhanced chemical vapor deposition, atomic layer deposition, plasma-enhanced atomic layer deposition and/or physical vapor deposition. In some embodiments, the metal film 225 is formed by atomic layer deposition or plasma-enhanced atomic layer deposition.

In some embodiments, the metal film 225 forms conformally on the at least one feature 210. As used herein, the term "conformal", or "conformally", refers to a layer that adheres to and uniformly covers exposed surfaces with a thickness having a variation of less than 1% relative to the average thickness of the film. For example, a 1,000 Å thick film would have less than 10 Å variations in thickness. This thickness and variation includes edges, corners, sides, and the bottom of recesses. For example, a conformal layer deposited by ALD in various embodiments of the disclosure would provide coverage over the deposited region of essentially uniform thickness on complex surfaces.

In some embodiments, the metal film 225 is deposited to a thickness in the range of about 25 Å to about 200 Å, or in the range of about 50 Å to about 150 Å. In one or more embodiments, the metal film 225 is deposited to a thickness of about 50 Å and there is substantially no seam formed in the film. The formation of the seam occurs where the thickness of the film closes on the top part of the feature 210 before the feature is filled with the film. In some embodiments, the substrate surface has a film with a seam between the sidewalls of the at least one feature. As used in this regard, the term "between" means that there is some film on either side of the seam between the seam and the sidewall of the feature. The seam is not limited to being exactly in the center of the sidewalls.

In some embodiments, the metal film 225 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

In some embodiments, the metal film 225 is formed substantially seamlessly within the feature 210. In some embodiments, a seam may be formed within the width of the feature 210. The seam can be any gap, space or void that forms between the walls 214, 216 of the feature 210.

The metal film 225 can be any suitable metal containing film with an average oxidation state of +0. In some embodiments, the film 225 consists essentially of metal atoms.

With reference to FIG. 3B, the metal film 225 is partially oxidized to form a film 230. As with the method described with reference to FIGS. 2A to 2C, film 230 can be any suitable material with an oxidation state less than the oxidation state of the full oxide. In some embodiments, the film 230 is a metal sub-oxide film. The oxidation reaction which converts metal film 225 to film 230 can be any reaction which increases the oxidation state of the metal atoms present in the metal film 225. Suitable reactions include, but are not limited to, oxidation reactions, boronation reactions, nitridation reactions, siliciding reactions or germaniciding reactions. Those skilled in the art will understand that other processes and reactions may be used to treat metal film 225 to form film 230. Regardless of the treatment selected, the film 230 formed has an oxidation state less than that of the metal in its fully oxidized form.

In some embodiments, the metal film 225 is expanded by exposure to an oxidizing agent or oxidizing conditions. The oxidizing agent can be any suitable oxidizing agent including, but not limited to, $O_2$, $O_3$, $N_2O$, $H_2O$, $H_2O_2$, CO, $CO_2$, $NH_3$, $N_2$/Ar, $N_2$/He, $N_2$/Ar/He and combinations thereof. In some embodiments, the oxidizing conditions comprise a thermal oxidation, plasma enhanced oxidation, remote plasma oxidation, microwave and radio-frequency (e.g., ICP, CCP).

In some embodiments, the metal film 225 is expanded by exposure to a nitridation agent or nitridation conditions to convert the metal to a metal nitride film. The nitridation agent can be any suitable nitridation agent including, but not limited to, ammonia, hydrazine, $NO_2$, $N_2$/Ar plasma, $N_2$/He plasma, $N_2$/Ar/He plasma and combinations thereof. In some embodiments, the nitridation conditions comprise a thermal nitridation, plasma enhanced nitridation, remote plasma nitridation, microwave and radio-frequency (e.g., ICP, CCP).

In some embodiments, the metal film 225 is expanded by exposure to a siliciding agent or siliciding conditions to convert the metal to a metal silicide film. The siliciding agent can be any suitable siliciding agent including, but not limited to, silane, disilane, trisilane, tetrasilane, pentasilane, hexasilane, trimethyl silane, compounds with trimethylsilyl substituents and combinations thereof. In some embodiments, the siliciding conditions comprise a thermal siliciding, plasma enhanced siliciding, remote plasma siliciding, microwave and radio-frequency (e.g., ICP, CCP).

In some embodiments, the metal film 225 is expanded by exposure to a germanium agent or germaniciding conditions to convert the metal to a metal germanicide film. The germaniciding agent can be any suitable germaniciding agent including, but not limited to, germane, digermane, trigermane, tetragermane, pentagermane, hexagermane, trimethyl germanium, compounds with trimethylgermanyl substituents and combinations thereof. In some embodiments, the germaniciding conditions comprise a thermal germaniciding, plasma enhanced germaniciding, remote plasma germaniciding, microwave and radio-frequency (e.g., ICP, CCP).

Treating the metal film 225 can occur at any suitable temperature depending on, for example, the composition of the metal film and the desired treatment. In some embodiments, the metal film treatment occurs at a temperature in the range of about 25° C. to about 1100° C. In some embodiments, treatment occurs at a temperature greater than or equal to about 250° C., 300° C., 350° C., 400° C., 450° C., 500° C. or 550° C.

In FIG. 3C, the film 230 is removed from the top surface 220 such that it is contained entirely within the feature 210. The film 230 can be removed by any suitable etch process. In some embodiments, the film 230 is removed by a chemical-mechanical planarization (CMP) process.

In some embodiments, substantially all of the metal film 225 is formed within the feature 210. As used in this regard, the term "substantially all" means that greater than or equal to about 95%, 98% or 99% of the film is formed within the feature 210 on a weight basis.

In some embodiments, the metal film 225 is selectively deposited within the feature 210 and is not deposited on the top surface 220 of the substrate. In these embodiments, the substrate 200 would be processed such that the metal film 225 would be deposited and treated to form film 230 entirely within the feature 210. The substrate would flow from FIG. 1 to FIG. 3C without appearing like FIG. 3A or 3B. The compositions of the first surface material 250 and the second surface material 260 can be chosen to allow selective deposition of the metal film 225 on one surface relative to the other.

In some embodiments, the method includes selectively depositing a metal film 225 within the trench to a height H less than or equal to the depth of the feature 210. In one embodiment, the metal film 225, fills at least 10% of the volume of the trench. In other embodiments, the film 130 fills at least 15%, 20%, 25%, 30%, 35%, 40%, 45%, 50%, 55%, 60%, 65%, 70%, 75%, 80%, 85%, 90%, 95% or 100% of the volume of the trench. In some embodiments, the metal film 225 deposited in the feature 210 has a height H that is less than or equal to about 98%, 95%, 90%, 80%, 70%, 60% or 50% of the depth of the feature 210.

As shown in FIG. 3D, the processing method further comprises treating the film 230 to expand the film material volume to provide an expanded film 240. The expanded film 240 extends beyond the top surface 220 of the substrate. The expanded film 240 comprises a metal oxide. The expanded film 240 forms a self-aligned structure. In all other respects, the treatment of film 230 to form expanded film 240 as shown in FIG. 3D is similar to the process described above for FIG. 2C.

Metal oxide pillars can be formed in features as self-aligned structures. A metal film can be used to line a trench. The metal film can be treated to form a metal sub-oxide film lining the trench. The metal film may be repeatedly deposited and treated until the trench is filled to a predetermined depth with a metal sub-oxide film. Any over-burden (i.e., metal or metal sub-oxide deposited on top of the substrate outside of the trenches or above the top surface of the substrate) is removed by a chemical-mechanical planarization (CMP) process to separate the metal sub-oxide lines. The resulting metal sub-oxide lines can be annealed with oxidizing atmosphere to form metal oxide pillars.

With reference to FIGS. 4A through 4D, a substrate 200 is provided for processing. The substrate 200 is similar to the substrate 100 shown in FIG. 1. As used in this regard, the term "provided" means that the substrate is placed into a position or environment for further processing. The substrate 200 illustrated in FIG. 3A has a first surface material 250 and a second surface material 260. The first surface material 250 and the second surface material 260 may be the same or different surface materials on the substrate 200. The feature 210 is formed with the bottom 212 being the first surface material 250 and the sidewalls 214, 216 and the top surface 220 being the second surface material 260.

A metal film 225 is formed on the top surface 220 and the walls and bottom of the feature 210. The metal film 225 can be any suitable film formed by any suitable process including, but not limited to, chemical vapor deposition, plasma-enhanced chemical vapor deposition, atomic layer deposition, plasma-enhanced atomic layer deposition and/or physical vapor deposition. In some embodiments, the metal film 225 is formed by atomic layer deposition or plasma-enhanced atomic layer deposition.

In some embodiments, the metal film 225 forms conformally on the at least one feature 210. As used herein, the term "conformal", or "conformally", refers to a layer that adheres to and uniformly covers exposed surfaces with a thickness having a variation of less than 1% relative to the average thickness of the film. For example, a 1,000 Å thick film would have less than 10 Å variations in thickness. This thickness and variation includes edges, corners, sides, and the bottom of recesses. For example, a conformal layer deposited by ALD in various embodiments of the disclosure would provide coverage over the deposited region of essentially uniform thickness on complex surfaces.

In some embodiments, the metal film 225 is deposited to a thickness in the range of about 25 Å to about 200 Å, or in the range of about 50 Å to about 150 Å. In one or more embodiments, the metal film 225 is deposited to a thickness of about 50 Å and there is substantially no seam formed in the film. The formation of the seam occurs where the thickness of the film closes on the top part of the feature 210 before the feature is filled with the film. In some embodiments, the substrate surface has a film with a seam between the sidewalls of the at least one feature. As used in this regard, the term "between" means that there is some film on either side of the seam between the seam and the sidewall of the feature. The seam is not limited to being exactly in the center of the sidewalls.

In some embodiments, the metal film 225 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

In some embodiments, the metal film 225 is formed substantially seamlessly within the feature 210. In some embodiments, a seam may be formed within the width of the feature 210. The seam can be any gap, space or void that forms between the walls 214, 216 of the feature 210.

The metal film 225 can be any suitable metal containing film with an average oxidation state of +0. In some embodiments, the film 225 consists essentially of metal atoms.

Figure 4A:
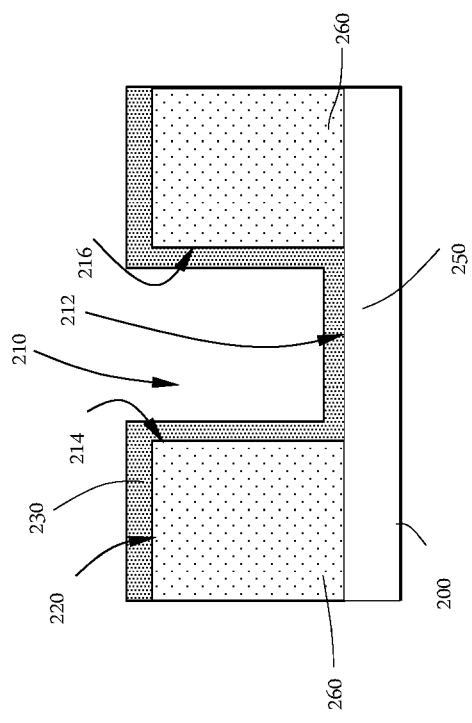
FIGS. 4A through 4D show a cross-sectional schematic of a self-aligned structure formation process in accordance with one or more embodiments of the disclosure.
Figure 4B:
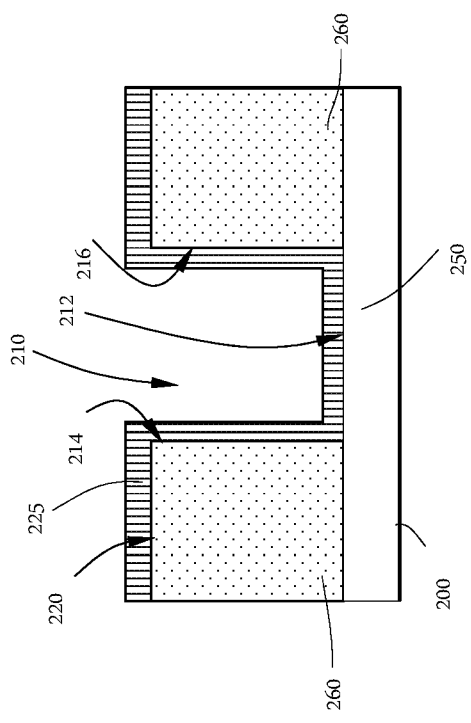
Figure 4C:
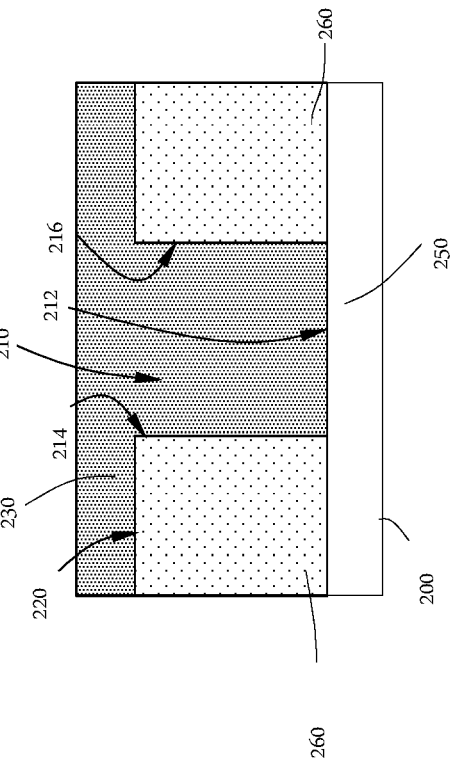

With reference to FIG. 4B, the metal film 225 is partially oxidized to form a film 230. As with the method described with reference to FIGS. 2A to 2C, film 230 can be any suitable material with an oxidation state less than the oxidation state of the full oxide. In some embodiments, the film 230 is a metal sub-oxide film. The oxidation reaction which converts metal film 225 to film 230 can be any reaction which increases the oxidation state of the metal atoms present in the metal film 225. Suitable reactions include, but are not limited to, oxidation reactions, boridation reactions, nitridation reactions, siliciding reactions or germaniciding reactions. Those skilled in the art will understand that other processes and reactions may be used to treat metal film 225 to form film 230. Regardless of the treatment selected, the film 230 formed has an oxidation state less than that of the metal in its fully oxidized form.

The process illustrated for FIGS. 4A and 4B, comprises depositing a layer of the metal film 225 and then treating the deposited metal film to form a sub-oxide film 230. This process can be repeated until the feature 210 is filled to a predetermined depth with sub-oxide film, as pictured in FIG. 4C. In some embodiments, the depth of the film deposited on the top surface of the substrate 220 may increase with each deposition and treatment cycle.

Figure 4D:
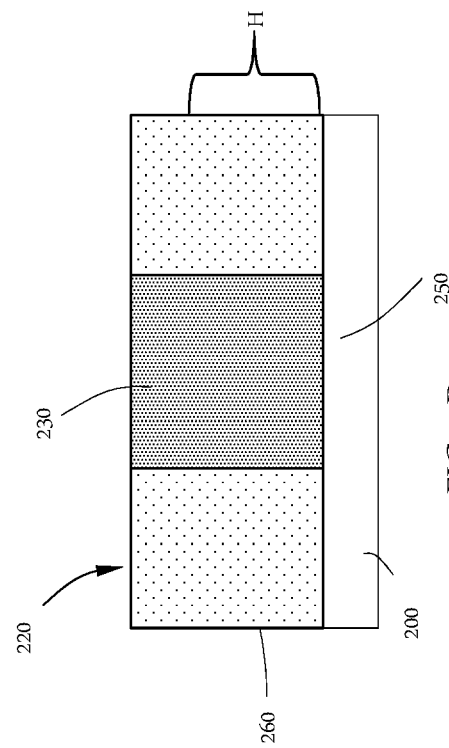

In FIG. 4D, the film 230 is removed from the top surface 220 such that it is contained entirely within the feature 210. The film 230 can be removed by any suitable etch process. In some embodiments, the film 230 is removed by a chemical-mechanical planarization (CMP) process.

In some embodiments, substantially all of the metal film 225 is formed within the feature 210. As used in this regard, the term "substantially all" means that greater than or equal to about 95%, 98% or 99% of the film is formed within the feature 210 on a weight basis.

In some embodiments, the metal film 225 is selectively deposited within the feature 210 and is not deposited on the top surface 220 of the substrate. In these embodiments, the substrate 200 would be processed such that the metal film 225 would be deposited and treated to form film 230 entirely within the feature 210. The substrate would flow from FIG. 1 to FIG. 4D without appearing like FIG. 4A, 4B or 4C. The compositions of the first surface material 250 and the second surface material 260 can be chosen to allow selective deposition of the metal film 225 on one surface relative to the other.

In some embodiments, the method includes selectively depositing a metal film 225 within the trench, then treating the metal film 225 in the trench to form film 230. This process of depositing and treating can be repeated until a film 230 with a height H less than or equal to the depth of the feature 210 is formed. In one embodiment, after repeated cycles of deposition and treatment, the film 230, fills at least 10% of the volume of the trench. In other embodiments, the film 230 fills at least 15%, 20%, 25%, 30%, 35%, 40%, 45%, 50%, 55%, 60%, 65%, 70%, 75%, 80%, 85%, 90%, 95% or 100% of the volume of the trench. In some embodiments, the film 230 formed in the feature 210 after repeated deposition and treatment cycles has a height H that is less than or equal to about 98%, 95%, 90%, 80%, 70%, 60% or 50% of the depth of the feature 210.

While not illustrated, the processing method further comprises treating the film 230 to expand the film material volume to provide an expanded film 240, similar to the process depicted in FIG. 2C or 3D. The expanded film 240 extends beyond the top surface 220 of the substrate. The expanded film 240 comprises a metal oxide. The expanded film 240 forms a self-aligned structure. In all other respects, the treatment of film 230 to form expanded film 240 is similar to the process described above for FIG. 2C.

Some embodiments include an optional treatment process. The treatment process treats the film 230 to improve some parameter of the film. In some embodiments, the treatment process comprises annealing the film. In some embodiments, treatment can be performed by in-situ anneal in the same process chamber used for deposition and/or oxidation. Suitable annealing processes include, but are not limited to, rapid thermal processing (RTP) or rapid thermal anneal (RTA), spike anneal, or UV cure, or e-beam cure and/or laser anneal. The anneal temperature can be in the range of about 500° C. to 900° C. The composition of the environment during anneal may include one or more of $H_2$, Ar, He, $N_2$, $NH_3$, $SiH_4$, etc. The pressure during anneal can be in the range of about 100 mTorr to about 1 atm.

According to one or more embodiments, the substrate is subjected to processing prior to and/or after forming the layer 230 or the expanded layer 240. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

While processes may be referred to as oxidation, those skilled in the art will understand that the disclosure is not limited to oxidation reactions to expand the film. The use of the oxidation reaction to describe various embodiments is for convenience only and is not limiting of the scope of the disclosure.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of producing a self-aligned structure of metal oxide, the method comprising:
   providing a substrate with a substrate surface with at least one feature formed therein, the at least one feature extending a distance into the substrate from the substrate surface and having a sidewall and bottom;
   forming a metal sub-oxide film on the substrate surface and in the at least one feature;
   removing the metal sub-oxide film from the substrate surface outside of the at least one feature; and
   oxidizing the metal sub-oxide film to form a self-aligned structure of metal oxide that expands from the at least one feature, the metal sub-oxide film having an average metal oxidation state in the range of greater than 0 to less than an average metal oxidation state of the metal oxide.

2. The method of claim 1, wherein the metal sub-oxide film has an average metal oxidation state less than or equal to about 80% of an average metal oxidation state of the metal oxide.

3. The method of claim 1, wherein the self-aligned structure is substantially orthogonal to the substrate surface.

4. The method of claim 1, wherein the metal sub-oxide film comprises one or more of metal oxide, metal nitride, metal carbide or metal silicide.

5. The method of claim 4, wherein the metal sub-oxide film consists essentially of metal nitride.

6. The method of claim 1, wherein the metal is tungsten.

7. The method of claim 6, wherein the metal oxide is $WO_3$.

8. The method of claim 7, wherein the metal sub-oxide film has a tungsten to oxygen ratio less than or equal to about 1:2.8.

9. The method of claim 8, wherein the self-aligned structure has a tungsten to oxygen ratio greater than or equal to about 1:2.85.

10. A method of producing a self-aligned structure of metal oxide, the method comprising:
    providing a substrate with a substrate surface with at least one feature formed therein, the at least one feature extending a distance into the substrate from the substrate surface and having a sidewall and bottom;
    forming a metal film on the substrate surface and in the at least one feature;
    treating the metal film to form a metal sub-oxide film on the substrate surface and in the at least one feature;
    removing the metal sub-oxide film from the substrate surface outside of the at least one feature; and
    oxidizing the metal sub-oxide film to form the self-aligned structure of metal oxide that expands from the at least one feature, the metal sub-oxide film having an average metal oxidation state in the range of greater than 0 to less than an average metal oxidation state of the metal oxide.

11. The method of claim 10, wherein the metal sub-oxide film has an average metal oxidation state less than or equal to about 80% of an average metal oxidation state of the metal oxide.

12. The method of claim 10, wherein the self-aligned structure is substantially orthogonal to the substrate surface.

13. The method of claim 10, wherein the metal film fills the at least one feature prior to treating the metal film to form the metal sub-oxide film.

14. The method of claim 10, wherein the metal film partially fills the at least one feature, the metal film is treated to form a metal sub-oxide film, and the method further comprises repeating formation of the metal film and treatment of the metal film to form the metal sub-oxide film until the metal sub-oxide film fills the at least one feature.

15. The method of claim 10, wherein the metal sub-oxide film consists essentially of metal nitride.

16. The method of claim 15, wherein the self-aligned structure has a tungsten to oxygen ratio greater than or equal to about 1:2.85.

17. The method of claim 10, wherein the metal is tungsten.

18. The method of claim 17, wherein the metal oxide is $WO_3$.

19. The method of claim 18, wherein the metal sub-oxide film has a tungsten to oxygen ratio less than or equal to about 1:2.8.

20. A method of producing a self-aligned structure of metal oxide, the method comprising:

(A) providing a substrate with a substrate surface with at least one feature formed therein, the at least one feature extending a distance into the substrate from the substrate surface and having a sidewall and bottom;

(B) forming a metal film on the substrate surface that partially fills the at least one feature;

(C) treating the metal film to form a metal sub-oxide film;

(D) repeating (B) and (C) until a predetermined volume of the at least one feature has been filled;

(E) removing the metal sub-oxide film from the substrate surface outside of the at least one feature; and (F) oxidizing the metal sub-oxide film to form the self-aligned structure of metal oxide that expands from the at least one feature, the metal sub-oxide film having an average metal oxidation state in the range of greater than 0 to less than an average metal oxidation state of the metal oxide.

* * * * *